United States Patent
Schols et al.

(10) Patent No.: US 9,196,853 B2
(45) Date of Patent: Nov. 24, 2015

(54) TRIPLET EXCITATION SCAVENGING IN SOLID-STATE ORGANIC MATERIALS

(75) Inventors: Sarah Schols, Holsbeek (BE); Paul Heremans, Leuven (BE); Andrey Kadashchuk, Kiev (UA)

(73) Assignees: KATHOLIEKE UNIVERSITEIT LEUVEN, K.U. LEUVEN R&D, Leuven (BE); IMEC, Leuven (BE)

( * ) Notice: Subject to any disclaimer, the term of this patent is extended or adjusted under 35 U.S.C. 154(b) by 1173 days.

(21) Appl. No.: 13/143,030

(22) PCT Filed: Jul. 24, 2009

(86) PCT No.: PCT/EP2009/059558
§ 371 (c)(1),
(2), (4) Date: Sep. 26, 2011

(87) PCT Pub. No.: WO2010/078973
PCT Pub. Date: Jul. 15, 2010

(65) Prior Publication Data
US 2012/0007024 A1 Jan. 12, 2012

Related U.S. Application Data

(60) Provisional application No. 61/143,303, filed on Jan. 8, 2009.

(51) Int. Cl.
*H01L 51/54* (2006.01)
*H01L 51/50* (2006.01)
*H01S 5/36* (2006.01)

(52) U.S. Cl.
CPC ........ *H01L 51/5012* (2013.01); *H01L 51/5024* (2013.01); *H01L 51/5028* (2013.01); *H01S 5/36* (2013.01); *C09K 2211/1011* (2013.01); *H01L 51/5016* (2013.01)

(58) Field of Classification Search
CPC . H01L 51/50; H01L 51/5012; H01L 51/5024; H01L 51/5028; H01S 5/36; C09K 2211/1011; H05B 33/14
See application file for complete search history.

(56) References Cited

U.S. PATENT DOCUMENTS

2005/0095456 A1    5/2005    Takeda

FOREIGN PATENT DOCUMENTS

WO    WO2008/119021    10/2008

OTHER PUBLICATIONS

Gorman et al. "A pulse radiolysis and pulsed laser study of the pyrromethene 567 triplet state" Journal of Photochemistry and Photobiology A: Chemistry. 2000. vol. 130, pp. 127-132.*
International Search Report and Written Opinion, PCT International Application No. PCT/EP2009/059558 dated Dec. 4, 2009.
Costela, A. et al., Studies on Laser Action from Polymeric Matrices Dopoed With Coumarin 503, Applied Physics B, vol. 67, 1998, pp. 167-173.
Ahmad, Mohammad et al., "Photostability of Lasers Based on Pyrromethene 567 in Liquid and Solid-State Host Media", Optics Communications, vol. 203, No. 3-6, 2002, pp. 327-334.
King, Terence et al., "Dye-Triplet-State and Singlet-Oxygen Quenching Effects in Solid State Dye Lasers", Proceedings of the SPIE, vol. 3929, 2000, pp. 145-153.
Verlaak, Stijn et al., "Numerical Simulation of Tetracene Light-Emitting Transistors: A Detailed Balance of Exciton Processes", Applied Physics Letters, vol. 85, No. 12, Sep. 20, 2004, pp. 2405-2407.
Marling, J.B. et al., "Chemical Quenching of the Triplet State in Flashlamp-Excited Liquid Organic Lasers", Applied Physics Letters, vol. 17, No. 12, Dec. 15, 1970, pp. 527-530.

* cited by examiner

*Primary Examiner* — Michael H Wilson
(74) *Attorney, Agent, or Firm* — McDonnell Boehnen Hulbert & Berghoff LLP

(57) ABSTRACT

The present invention is directed to solid state organic light emitting devices and to methods for triplet excitation scavenging in such devices. More particularly, the present invention relates to a method for substantially reducing a triplet population in a solid state organic material, the method comprising providing molecules exhibiting non-vertical triplet energy transfer in the solid state organic material or at a distance smaller than a triplet exciton diffusion length from the solid state organic material.

11 Claims, 3 Drawing Sheets

TRIPLET EXCITATION SCAVENGING IN SOLID-STATE ORGANIC MATERIALS

TECHNICAL FIELD OF THE INVENTION

This invention relates to solid state organic light emitting devices and to methods for triplet excitation scavenging in such devices.

BACKGROUND OF THE INVENTION

The vivid interest in organic semiconductor materials is stimulated by the technological aspects of applications that employ these new materials in organic light emitting diodes (OLEDs), thin-film field-effect transistors, solar cells and biological sensors. Some products, such as emissive OLED displays, have gained rapid acceptance in portable displays because of their bright emission and low power consumption. The remarkable technological breakthroughs in the development of highly efficient OLEDs and the demonstration of optically-pumped lasing using the same class of organic semiconductors have focused an increasing interest in the prospects for making electrically-pumped organic solid-state lasers. Lasing action has been studied in a variety of optically pumped structures (e.g., microcavities, distributed feedback (DFB) structures, . . . ) that demonstrate the feasibility of organic thin-film materials as active laser media.

Electrical pumping of organic light-emitting devices, however, has to date not been proven successful in achieving any lasing emission. The combination of several issues makes electrical excitation a particularly tough problem for organic semiconductor lasers. They suffer from considerable losses originating from the electrical contacts, the depletion of excitations by junction current (exciton-polaron quenching), absorption by polarons, exciton-exciton annihilation, etc. . . . One of the main problems associated with electrically pumped organic semiconductor lasers is the inevitable population and accumulation of triplet excitations, which results in excessive triplet-state losses preventing lasing (i.e. which results in excessive losses caused by triplet-state excitations, and which in turn will prevent lasing), as e.g. described by S. Verlaak et al. in "Numerical simulation of tetracene light-emitting transistors: a detailed balance of exciton processes", Applied Physics Letters, 2004, Vol. 85, p 2405. If conventional spin statistics applies, the recombination of injected charge carriers leads to the creation of a majority (e.g. about 75%) of (non-emissive) triplet excitations in the active organic semiconductor layer. Due to their long lifetime, these triplet excitations can act as metastable species, which generally have fairly high absorptions to the upper triplet state (triplet-triplet absorption) at the expected fluorescent lasing wavelength. Such a problem is inherent to organic materials and is a well-known issue also in classical liquid-state organic dye lasers employing highly fluorescent organic dye molecules dissolved in organic solvents. Triplet-state losses (i.e. losses caused by triplet-states) often limit the lasing performance of these dye lasers, especially at continuous wave (cw) operation. Consequently, organic dye lasers normally operate in pulsed mode (with a pulse duration of several nanoseconds) using a short-pulse flash-lamp for pumping, since only in this way the accumulation of dye molecules in the triplet state can be overcome.

To circumvent this problem, a commonly accepted practice in liquid-state organic dye lasers is to use the so-called triplet (excitation) scavengers. It was demonstrated that the accumulation of dye molecules in the triplet state can be reduced by adding such triplet scavenging molecules to the dye solution (e.g. as reported by J. B. Marling et al in "Chemical quenching of the triplet state in flashlamp-excited liquid organic lasers", Applied Physics Letters, Vol. 17, Nr. 12, 1970). In this way quenching of lasing emission by triplets might be almost eliminated. To reduce triplet accumulation, the triplet (excitation) scavenger molecule should meet a set of important requirements. It should have the ability to accept a triplet excitation from the dye molecules, implying that its triplet level should be sufficiently low. At the same time its singlet level should be high enough to prevent quenching of singlet excitations of the dye molecules. This implies thus that the $S_1$-$T_1$ splitting for the triplet scavenger should be extraordinary large. Furthermore, it should posses a reasonably short intrinsic triplet lifetime to deplete quickly the triplet population and/or have intrinsic triplet-triplet absorption shifted far from the region of lasing of the dye molecules. In addition it should not enhance intersystem crossing of the dye molecules to prevent conversion of singlets into triplet excitations. This criterion imposes limitations for employing compounds containing heavy atoms (such as e.g. metal-organic complexes) as triplet scavengers. Taking into account all these requirements, it is not surprising that there are just a very limited number of efficient triplet scavengers available today.

A cyclic nonaromatic polyene, 1,3,5,7-cyclooctatetraene (COT) is the most popular and efficient triplet scavenger used in liquid-state organic dye lasers. This is related to its unique combination of properties, namely the ability to quench host triplets with an energy as small as 0.8 eV and its very short triplet lifetime (~100 μs). The use of COT as an efficient triplet scavenger for several laser dye solutions is well documented. The mechanism for the energy transfer process has also been investigated in detail. Unlike molecular oxygen, which is known as a notorious triplet quencher due to its triplet ground state, COT can quench the triplet state without increasing the intersystem crossing rate and without oxidation of the dye molecules. To the best of the Applicant's knowledge, COT was used so far only in dye solutions. COT is a flexible molecule in the ground state and belongs to the "non-classical" triplet acceptors, which exhibit anomalous non-vertical (non-adiabatic) triplet energy transfer. It is known that quenching of a host triplet by a non-vertical triplet scavenger such as COT requires a planarization (and thus a structural reorganization or geometrical distortion) of the COT molecule during the triplet transfer. Given the need for a structural reorganization, it can be expected that triplet quenching by non-vertical triplet energy transfer can only be obtained in an environment wherein such a structural reorganization is not hindered, such as e.g. in a liquid environment.

Classical vertical triplet energy transfer has been well documented for solid films of conjugated semiconducting polymers such as PPV derivatives, polyfluorenenes and MeLPPP. However, it is very difficult to find vertical triplet scavengers that meet the requirements (described above) for reducing triplet accumulation. An important requirement for a suitable triplet scavenger is a very large $S_1$-$T_1$ splitting. In addition the triplet scavenger should (preferably) not enhance intersystem crossing of the host molecules. An example of a vertical triplet acceptor meeting these requirements is anthracene. However, this molecule has a long triplet lifetime (several tens of ms), such that the triplet population is not reduced.

Aims of the Invention

It is an aim of the present invention to provide methods for efficient triplet scavenging or quenching in solid state organic materials, e.g. in solid state organic light-emitting materials, in order to reduce a total triplet population. This aim is achieved by incorporating a molecule exhibiting non-vertical triplet energy transfer (such as e.g. a non-vertical triplet scavenger) in the solid state organic material or at a distance from the solid state organic material that is smaller than the triplet exciton diffusion length, e.g. at a distance smaller than 100 nm.

It was surprisingly found that this allows obtaining an efficient reduction of the triplet population in solid state organic materials (without reducing the singlet exciton density. This effect is due (preferably) to a large splitting between a singlet level and a (relaxed) triplet level of the scavenger, a short intrinsic triplet lifetime of the scavenger, and the absence of any enhancement of intersystem crossing of the solid state organic molecules.

SUMMARY OF THE INVENTION

The present invention provides a method for substantially reducing a triplet population in a solid state organic material (without reducing the singlet exciton density), the method comprising providing molecules exhibiting non-vertical triplet energy transfer in the solid state organic material or providing such molecules at a distance smaller than the triplet exciton diffusion length from the solid state organic material, e.g. at a distance smaller than (about) 100 nm from the solid state organic material.

Preferably, the method for substantially reducing a triplet population in a solid state organic material, according to the invention, is performed without reducing the singlet exciton density in the solid organic material.

Preferably, in the method according to the invention, the molecules exhibiting non-vertical triplet energy transfer comprise (or consist of) suitable non-vertical triplet scavenging material. More preferably, suitable non-vertical triplet scavenging material meets (all of) the following set of requirements:
  a) the triplet level of the non-vertical triplet scavenger (molecule) is lower than the triplet level of the solid-state organic material;
  b) the singlet level of the non-vertical triplet scavenger (molecule) is higher than the singlet level of the solid-state organic material;
  c) the non-vertical triplet scavenger (molecule) possesses an intrinsic triplet lifetime which is shorter than the triplet lifetime of the solid-state organic material, preferably shorter than (about) 200 µs, more preferably shorter than (about) 100 µs, even more preferably shorter than (about) 50 µs; and
  d) the non-vertical triplet scavenger (molecule) does not enhance intersystem crossing of the solid-state organic material.

In a preferred aspect of the method according to the invention, the $S_1$-$T_1$ splitting of the non-vertical triplet scavenger (molecule) is above (about) 1 eV, preferably above (about) 2 eV, more preferably above (about) 3 eV.

In still a more preferred aspect of the method according to the invention, the molecule exhibiting non-vertical triplet energy transfer is selected from the group consisting of COT, cycloheptatriene (CHT), cis-stilbene, and combinations thereof. Preferably still, the molecule exhibiting non-vertical triplet energy transfer is selected to be COT.

Preferably, in the method according to the invention, the molecule exhibiting non-vertical triplet energy transfer is preferably provided at a distance from the solid state organic material which is shorter than (about) 100 nm, preferably shorter than (about) 50 nm, more preferably shorter than (about) 10 nm, even more preferably shorter than (about) 1 nm.

Preferably, in the method according to the invention, the molecule exhibiting non-vertical triplet energy transfer for use herein is a non-vertical triplet scavenger.

Preferably, in the method according to the invention, the solid state organic material for use herein may comprise a light emitting material.

According to another aspect, the present invention further provides an organic light emitting device comprising a solid state light emitting material, the light emitting device comprising means for substantially reducing a triplet population (without reducing the singlet exciton density).

Preferably, in the organic light emitting device according to the invention, the means for substantially reducing a triplet population (without reducing the singlet exciton density) may comprise molecules exhibiting non-vertical triplet energy transfer being provided in the solid state organic material or at a distance smaller than the triplet exciton diffusion length from the solid state organic material, e.g. at a distance smaller than (about) 100 nm from the solid state organic material.

More preferably, in the organic light emitting device according to the invention, the molecule exhibiting non-vertical triplet energy transfer is provided at a distance from the solid state organic material which is shorter than (about) 100 nm, preferably shorter than (about) 50 nm, more preferably shorter than (about) 10 nm, even more preferably shorter than (about) 1 nm.

In another preferred aspect of the organic light emitting device according to the invention, the molecules exhibiting non-vertical triplet energy transfer are non-vertical triplet scavengers, preferably selected from the group consisting of COT, cycloheptatriene (CHT), cis-stilbene, and combinations thereof.

According to still another aspect, the present invention relates to the use of molecules exhibiting non-vertical triplet energy transfer for substantially reducing the triplet population in a solid state organic material (and without reducing the singlet exciton density).

Preferably, in the use according to the invention, the molecules exhibiting non-vertical triplet energy transfer are non-vertical triplet scavengers, preferably selected from the group consisting of COT, cycloheptatriene (CHT), cis-stilbene, and combinations thereof.

The subject matter regarded as invention is particularly pointed out and distinctively claimed in the claim section concluding this document. The invention however, both as to organization and method of operation, together with features and advantages thereof, may best be understood by reference to the following detailed description when read with the accompanying drawings.

BRIEF DESCRIPTION OF THE DRAWINGS

FIG. 1(*d*) shows the energy level scheme for these materials. The dashed line indicates the position of the $T_1$ triplet state of the COT molecule. This triplet state is lowered during energy transfer due to molecular relaxation. The position of the relaxed triplet state of the COT molecule is indicated by $T_1^*$.

DETAILED DESCRIPTION OF THE INVENTION

Figure 1:
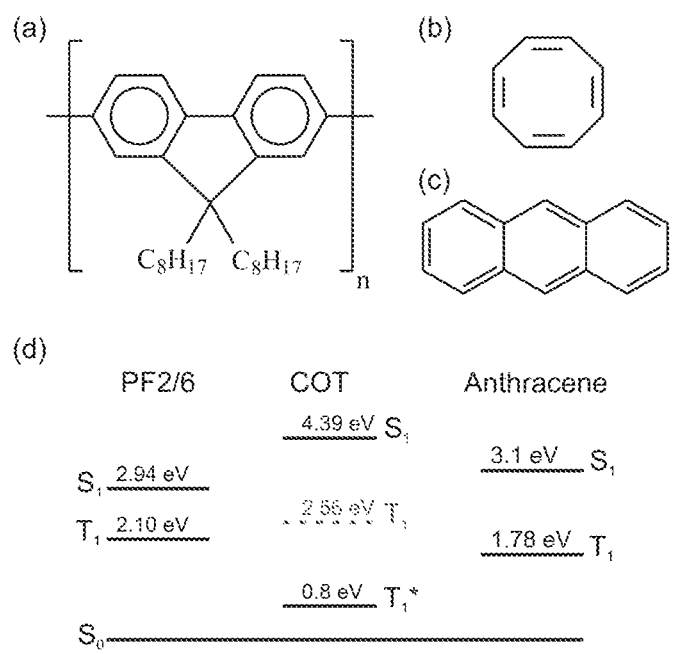
FIG. 1 shows the molecular structure of Poly(9,9-bis(2-ethylhexyl)fluorene-2,7-diyl(PF2/6) (FIG. 1(*a*)), COT (FIG. 1(*b*)), and anthracene (FIG. 1(*c*)).

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

According to one aspect, the present invention relates to a method for substantially reducing a triplet population in a solid state organic material (without reducing the singlet exciton density), the method comprising providing molecules exhibiting non-vertical triplet energy transfer in the solid state organic material or at a distance smaller than a triplet exciton diffusion length from the solid state organic material.

In the further description, the terms "vertical scavenging", "vertical triplet energy transfer", "non-vertical scavenging" and "non-vertical triplet energy transfer" are used. Triplet energy transfer is a common process in organic electronics. In this process, the triplet energy of a donor molecule in its triplet state is transferred to an acceptor molecule in its singlet ground state. Generally, an electronic transition is termed "vertical" with respect to the equilibrium geometry, conveying the idea that the electron is excited to the upper state before the nuclei have had the time to re-equilibrate (also called "adiabatic transition"). This is related to the Franck-Condon principle according to which the electronic transitions occur "vertically" since no change of the internuclear distance occurs during the fast electron transition. In other words, the nuclei are considered to be static with respect to the electrons' changes and movements and the nuclear coordinates can be separated from the electronic part. It also implies that triplet energy transfer (transitions) to an acceptor molecule are normally "vertical", meaning that they are not changing the geometry of the (acceptor) molecule. This is true for organic molecules with a rigid framework which can be considered as "classical" triplet acceptors. For classical triplet acceptors, the triplet energy transfer process depends mainly on the triplet energy of the (acceptor) molecule, implying that the triplet energy transfer is a thermally activated process in the case when the energy of the accepting molecule is higher than that of donor molecule (i.e. negative energy balance, $\Delta E_T < 0$). Non-vertical transitions imply violation of the Franck-Condon principle and strong deformation of the acceptor molecule (also called "non-adiabatic transition"). Non-vertical triplet energy transfer can occur for some (triplet) acceptor compounds, such as e.g. COT, cycloheptatriene, cis-stilbene, implying that the acceptor geometry changes concurrently with its excitation. Such molecules, typically manifesting significant flexibility, are said to be non-classical (triplet) acceptors. In contrast to classical (triplet) acceptors, for non-classical or non-vertical (triplet) acceptors the triplet transfer depends not only on the triplet energy but also on the (acceptor) molecule itself (its flexibility and geometrical distortion). Experimentally, non-vertical triplet acceptors exhibit a considerably faster triplet transfer rate in the regime of negative energy balance $\Delta E_T<0$ (endothermic situation, i.e. when the triplet state energy of the donor molecule is lower than that of the accepting molecule), compared to that predicted for a thermally activated Arrhenius process. This is a consequence of the fact that the relaxed triplet state of the non-vertical acceptor has a considerably lower energy than that of the non-relaxed one. Due to the low-energy relaxed triplet state, non-vertical triplet acceptors can capture relatively low lying triplet excitations of donor molecules. For instance, a non-vertical (triplet) acceptor such as COT can quench donor triplets with an energy $\geq 0.8$ eV. Also, due to the relatively small energy distance between the relaxed triplet state and the ground state of such compounds, their triplet state has inherently a short lifetime. This is because the probability of non-radiative energy dissipation increases exponentially with lower energy distance between the triplet state and the ground state. Since the non-vertical triplet energy transfer requires considerable flexibility of the acceptor molecules, such process has been well studied in solutions where there are no steric restrictions for molecular deformations.

One of the main problems associated with electrically pumped organic semiconductor lasers is the inevitable population and accumulation of triplet excitations, which result in excessive triplet-state losses preventing lasing. To circumvent the problem the commonly accepted practice in liquid-state organic dye lasers is to use the so-called triplet scavengers. It was demonstrated that the accumulation of dye molecules in the triplet state can be reduced by adding such triplet scavenging molecules to the dye solution. In this way quenching of lasing emission by triplets might be almost eliminated.

Accordingly, and in the context of the present invention, a "non-vertical triplet scavenger", is meant to represent a material (preferably a molecule) which has the ability to scavenge/quench or accept triplet excitations energy according to a non-vertical triplet energy transfer transition. Throughout the description, the expressions "triplet scavenger" and "triplet acceptor" are used interchangeably. In the context of the present invention also, "molecules exhibiting non-vertical triplet energy transfer" preferably comprise (or consist of) non-vertical triplet scavenging material (also preferably referred to herein as non-vertical triplet scavengers or non-vertical scavenging molecules).

To (efficiently) reduce triplet (excitation) accumulation of dye molecules in the triplet state, the triplet (excitation) scavenger molecule should (preferably) meet a set of important requirements:

It should have the ability to accept a triplet excitation from the dye molecules, implying that its triplet (energy) level should be sufficiently low.

At the same time its singlet (energy) level should be high enough to prevent quenching of singlet excitations of the dye molecules. This implies thus that the $S_1$-$T_1$ splitting for the triplet scavenger should be extraordinary large.

It should posses a reasonably short intrinsic triplet lifetime to deplete quickly the triplet population and/or have intrinsic triplet-triplet absorption shifted far from the region of lasing of the dye molecules.

It should not enhance intersystem crossing of the dye molecules, to prevent conversion of singlets into triplet excitations. This criterion imposes certain limitations for employing compounds containing heavy atoms (such as e.g. metal-organic complexes) as triplet scavengers.

By "$S_1$-$T_1$ splitting", it is herein meant to refer to the energy difference between the singlet level S1 and the triplet level T1 of the triplet scavenger (molecule). By "intrinsic triplet lifetime", it is meant herein to refer to the lifetime of the triplet excitation in absence of any quenching/scavenging mechanism. By "intrinsic triplet-triplet absorption", it is meant herein to refer to the absorption of light by a triplet excitation, which is then excited to a higher located energy level.

Taking into account all these requirements, it is not surprising that there are just a very limited number of efficient triplet scavengers available today.

A cyclic nonaromatic polyene, 1,3,5,7-cyclooctatetraene (COT), is the most popular and efficient triplet scavenger in liquid-state organic dye lasers due to its unique combination of properties, namely the ability to quench host triplets with an energy as small as 0.8 eV and its very short triplet lifetime (~100 µs). The use of COT as an efficient triplet scavenger for several laser dye solutions is well documented. It was used commercially in Rhodamine-6G dye lasers to reduce excited triplet absorption. The mechanism for the energy-transfer process has also been investigated in detail. Unlike molecular oxygen, which is known as a notorious triplet quencher due to its triplet ground state, COT could quench the triplet state without increasing the intersystem crossing rate and without oxidation of the dye molecules. However, to the best of the Applicant's knowledge, COT was used so far only in dye solutions.

COT is a flexible molecule in the ground state and belongs to the "non-classical" triplet acceptors, which exhibit anomalous non-vertical (non-adiabatic) triplet energy transfer. It is known that quenching of a host triplet by COT requires a planarization, i.e. a change in geometry, of the COT molecule during the triplet transfer.

Given the need for such a structural reorganization in order to obtain non-vertical triplet energy transfer, it can be expected that this mechanism may not work in solid state matrices because the geometrical distortion of the COT molecule may be hindered in a solid state environment. Moreover, the energy transfer mechanism in a solid state matrix (based on diffusion of triplet excitons) is different from the energy transfer mechanism in a solution (based on diffusion of molecules).

As opposed to non-vertical triplet energy transfer, classical vertical triplet energy transfer has been well documented for solid films of conjugated semiconducting polymers such as PPV (i.e. Poly(phenylene vinylene)) derivatives, polyfluorenenes and MeLPPP (i.e. methyl substituted ladder-type poly(para-phenylene)). However, it is very difficult to find vertical triplet scavengers that meet the requirements for (efficiently) reducing triplet accumulation. An important requirement for a suitable triplet scavenger is a very large $S_1$-$T_1$ splitting. In addition the triplet scavenger should preferably not enhance intersystem crossing of the host molecules. An example of a vertical triplet scavenger meeting these requirements is anthracene. However, this molecule has a long triplet lifetime (several tens of ms), such that the triplet population is not reduced.

It is known that quenching of a host triplet by a non-vertical triplet scavenger, such as e.g. COT, requires a planarization (and thus a structural reorganization or geometrical distortion) of the COT molecule during the triplet transfer. Given the need for a structural reorganization in order to obtain quenching of a host triplet, it can be expected that triplet quenching by non-vertical triplet energy transfer can only be obtained in an environment wherein there are no steric restrictions for molecular deformations, such as e.g. in a liquid environment. In a solid-state matrix the structural reorganization of a non-vertical triplet scavenger such as COT is expected to be hindered and thus it can be expected that the non-vertical triplet quenching mechanism may not work in such a solid environment. In addition, the triplet energy transfer mechanism in liquid solutions is different from that in a solid state matrix. Generally, triplet energy transfer is a resonant energy transfer usually described by the electron exchange Dexter mechanism. In this process, the triplet energy of an initially excited molecule (donor molecule) in its triplet state is transferred to another molecule (acceptor molecule) in its singlet ground state. Due to the short-range character of electron exchange interaction governing the triplet energy transfer in organic materials, a small distance (typically nm) is required between the donor and acceptor molecules to allow the process to take place. When molecules are separated in a liquid diluted solution, they may approach each other to a sufficiently small distance via a diffusion process of the acceptor and the donor molecules such that an 'encounter complex' can be formed where the triplet energy transfer process can take place. When the balance between the energies of the donor triplet state $E_T^D$ and the acceptor triplet state $E_T^A$, is positive ($E_T^D - E_T^A = \Delta E_T \geq 0$), the triplet energy transfer process in a liquid solution is controlled by diffusion of molecules. In case of a negative energy balance $\Delta E_T < 0$, the triplet energy transfer rate is additionally affected by a thermally activated Arrhenius process with activation energy $\Delta E_T$. In a solid state environment, organic molecules cannot diffuse easily, and the above molecular diffusion mechanism is not operative. Instead, when the solid state consists of identical molecules, triplet excitations can move between molecules in the solid matrix because of a sufficiently small intermolecular separation (typically less than 1 nm). Therefore, triplet excitations are capable of migrating in solid films and crystals, and they can reach a quenching center (triplet scavenger) by diffusion of triplet excitons.

Based on these considerations related to molecular deformations needed for obtaining non-vertical triplet scavenging and related to the different energy transfer mechanisms in liquid and solid environments, it can be expected that non-vertical triplet scavenging may not be obtained in a solid environment. However, it was surprisingly found that an efficient reduction of the triplet population can be obtained in solid organic materials by introducing a (suitable) non-vertical triplet scavenger in the solid organic material.

In other words, it was surprisingly found that non-vertical triplet (excitation) scavengers, such as e.g. COT, used before only in liquid-phase organic dye lasers, may also be used for scavenging host triplet excitations in solid-state organic materials such as e.g. highly fluorescent organic semiconductors.

In the context of the present invention, the use of COT was investigated in polymer films of a polyfluorene derivative. Polyfluorene is a prospective material for the fabrication of thin-film organic lasers where accumulation of triplets under electrical pumping is a very important issue. The results of this investigation were compared with those obtained by using a "classical" vertical triplet acceptor with rigid molecular framework (anthracene), which also possesses suitable energetic levels to scavenge polyfluorene host triplets.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In the further description, the present invention is illustrated with examples and experiments wherein COT is used in polymer films of a polyfluorene derivative (Poly(9,9-bis(2-ethylhexyl)fluorene-2,7-diyl) (PF2/6)). However, the invention is not limited to these materials. The PF2/6:COT material system is only an example. Also other materials or material combinations can be used. For example, the light-emitting material can comprise a fluorescent polymer belonging to the class of polyphenylenenvinylenes, polyfluorenes, polythiophenes, polyarylenes, poly(para-phenylene), etc.; it can comprise a light-emitting small molecule, such as tetracene, anthracene, perylenes, oligothiophenes, trishydroxyquinoline aluminium (Alq3), Coumarin 6, rubrene, p-sexiphenyl, spiro-compounds, 4-(Dicyanomethylene)-2-methyl-6-(julolindin-4-yl-vinyl)-4H-pyran (DCM2), etc.; it can comprise a light-emitting host-guest system, where the host behaves as a matrix for the light-emitting guest molecule. Examples of host-guest light-emitting material systems are Alq3:DCM2, N,N'-bis-(3-naphthyl)-N,N'-biphenyl-(1,1'-biphenyl)-4,4'-diamine (NPB):rubrene, Alq3:4-(dicyanomethylene)-2-t-butyl-6(1,1,7,7-tetramethyljulolidyl-9-enyl)-4H-pyran (DCJTB), etc. The list of materials is not intended to be restrictive, but only to provide examples. Other types of solid-state organic material include, but are not limited to, solid-state organic semi-conductor material, and solid-state organic light-emitting material, such as e.g. highly fluorescent organic semiconductors. Preferably, the solid-state organic material for use herein comprises organic light-emitting material.

In order to (efficiently) reduce the triplet accumulation, the solid-state organic material (such as e.g. light-emitting material) and the triplet-scavenging material preferably meet the following set of requirements:

The triplet scavenger has the ability to accept a triplet excitation from the solid-state organic material (such as e.g. light-emitting material), implying that its triplet (energy) level is sufficiently low, e.g. lower than the triplet (energy) level of the solid-state organic material (such as e.g. light-emitting material).

The triplet scavenger singlet (energy) level is sufficiently high, e.g. higher than the singlet (energy) level of the solid-state organic material (such as e.g. light-emitting material), to prevent quenching of singlet excitations of the solid-state organic material (such as e.g. light-emitting molecules).

This implies thus that the $S_1$-$T_1$ splitting of the triplet scavenger is extraordinary large.

The triplet scavenger possesses a reasonably short intrinsic triplet lifetime, e.g. shorter than the triplet lifetime of the solid-state organic material (such as e.g. light-emitting material), to deplete quickly the triplet population. The intrinsic triplet lifetime of the triplet scavenger is preferably shorter than (about) 100 µs.

The triplet scavenger does not enhance intersystem crossing of the solid-state organic material (such as e.g. light-emitting molecules), such that conversion of singlets into triplet excitations is prevented.

By "solid-state organic material", it is herein meant to refer preferably to molecules of said solid-state organic material. Similarly, by "triplet-scavenging material", it is herein meant to refer preferably to molecules of said "triplet-scavenging material".

By "large $S_1$-$T_1$ splitting", it is meant herein that the energy difference between the singlet level S1 and the triplet level T1 of the triplet scavenger (molecule) is preferably above (about) 1 eV. Preferably, the $S_1$-$T_1$ splitting is above (about) 2 eV, more preferably above (about) 3 eV. Even more preferably, the $S_1$-$T_1$ splitting is comprised between (about) 1.0 eV and (about) 3.0 eV, still more preferably between (about) 1.5 eV and (about) 2.0 eV.

By "reasonably short intrinsic triplet lifetime", it is meant herein that triplet scavenger (molecule) possesses an intrinsic triplet lifetime which is preferably shorter than (about) 200 µs. More preferably, the intrinsic triplet lifetime of the triplet scavenger (molecule) is shorter than 100 µs, even more preferably shorter than 50 µs. Typically, the triplet scavenger (molecule) possesses an intrinsic triplet lifetime which is shorter than the triplet lifetime of the solid-state organic material (such as e.g. light-emitting material), According to a preferred aspect of the invention, the triplet scavenger (molecule) also preferably possesses intrinsic triplet-triplet absorption shifted far from the region of lasing of the solid-state organic material (molecule), such as e.g. light-emitting material (molecule).

Examples of (suitable) non-vertical triplet acceptors or scavengers (or molecules exhibiting non-vertical triplet energy transfer) that can be used in embodiments of the present invention are COT, cycloheptatriene (CHT), cis-stilbene. This list of materials is not intended to be restrictive, but only to provide examples. Preferably, the non-vertical triplet scavenger (or molecule exhibiting non-vertical triplet energy transfer) for use herein is selected to be COT. The triplet scavenger can be used as a guest molecule in a matrix of the light-emitting material or material system. It can also be present as an additional layer.

The distance between the molecule exhibiting non-vertical triplet energy transfer (such as e.g. a non-vertical triplet scavenger (molecule)) and the solid-state organic material (such as e.g. a light-emitting material) is preferably smaller than the triplet exciton diffusion length of the organic material (molecule), which is typically between (about) 1 and (about) 100 nanometer. By "triplet exciton diffusion length", it is meant herein to refer to the distance that triplet excitations can move or migrate before they recombine or before they are quenched.

Preferably, the distance between the molecule exhibiting non-vertical triplet energy transfer (such as e.g. a non-vertical triplet scavenger (molecule)) and the solid-state organic material (molecule), such as e.g. a light-emitting material (molecule), is preferably shorter than (about) 100 nm, more preferably shorter than (about) 50 nm, even more preferably shorter than (about) 10 nm, yet more preferably shorter than (about) 1 nm.

For efficient scavenging of triplet population in a solid state organic material, the molecule exhibiting non-vertical triplet energy transfer (such as e.g. a non-vertical triplet scavenger (molecule)) is preferably provided at a distance between (about) 1 nm and (about) 100 nm, more preferably between (about) 1 nm and (about) 50 nm, even more preferably between (about) 1 nm and (about) 10 nm, from the solid-state organic material (molecule), such as e.g. a light-emitting material (molecule).

The use of such non-vertical triplet scavengers may range from nanoscale light sources for nanophotonics and nano-optoelectronics, laser applications, displays to automotive illuminations. The potential for applications, in particular for intense light generation sources such as high brightness OLEDs and organic lasers, arises from the fact that non-vertical triplet scavengers (suitable for use in the present invention) have an inherently short triplet lifetime and an inherently large $S_1$-$T_1$ splitting. These properties make a fast deactivation of triplet excitons possible without affecting the prompt fluorescence of the device. In this way the accumulation of triplets, which can cause severe losses in for example organic electrically pumped lasers, can be suppressed. The list of applications is not intended to be restrictive, but only to provide examples.

Experiments were done with Poly(9,9-bis(2-ethylhexyl) fluorene-2,7-diyl) (PF2/6) (molecular weight $M_n$=83500) as a light-emitting material and with cyclooctatetraene (COT) and anthracene as triplet acceptor or triplet scavenging material. The structural formulas of these compounds and the position of their $S_1$ and $T_1$ energy level are displayed in FIG. 1. FIG. 1(a) shows the molecular structure of PF2/6; FIG. 1(b) shows the molecular structure of COT, and FIG. 1(c) shows the molecular structure of anthracene. The energy level scheme of these materials is illustrated in FIG. 1(d). For the COT molecule, the dashed line indicates the position of the $T_1$ triplet state. This triplet state is lowered during energy transfer due to molecular relaxation. The position of the relaxed triplet state of the COT molecule is indicated by $T_1^*$.

Polymer films doped with COT triplet scavenger molecules were prepared by dissolving COT and PF2/6 in a ratio 1/10 in THF, and then drop-casting the resulting solutions on a precleaned quartz substrate. To delay evaporation of the COT, which is liquid at room temperature, the films were dried in a saturated COT environment. PF2/6 films doped with anthracene were prepared by spin-coating a 20 weight % solution from toluene at 1000 rpm. In order to exclude the presence of molecular oxygen in the fabricated organic films, solutions were prepared in a $N_2$-filled glovebox using de-aerated solvents.

Spectroscopic measurements of prompt fluorescence (PF) and delayed emission as delayed fluorescence (DF) and phosphorescence (Ph) of the films were carried out at 77 K, using a temperature regulating nitrogen cryostat. All measurements were done in nitrogen atmosphere to prevent photo-oxidation. A $N_2$ gas laser with pulse duration of 4 ns operated at 10 Hz was used for optical excitation at 337 nm. The emission spectra were recorded using a triple-grating monochromator coupled to an intensified CCD camera (PI-MAX from Princeton Instruments) with a time gated, intensified diode array detector, which was synchronized by the electrical trigger of the laser. To collect the delayed emission the detection window of 10 ms width of the intensified diode array detector was operated synchronously but delayed with respect to the laser pulse. A variable delay of 75 ns to 10 ms after the laser pulse excitation allowed the detection of weak delayed luminescence after the intense prompt fluorescence. To increase the signal-to-noise ratio, spectra were accumulated by averaging over 100 to 300 pulses.

Figure 2:
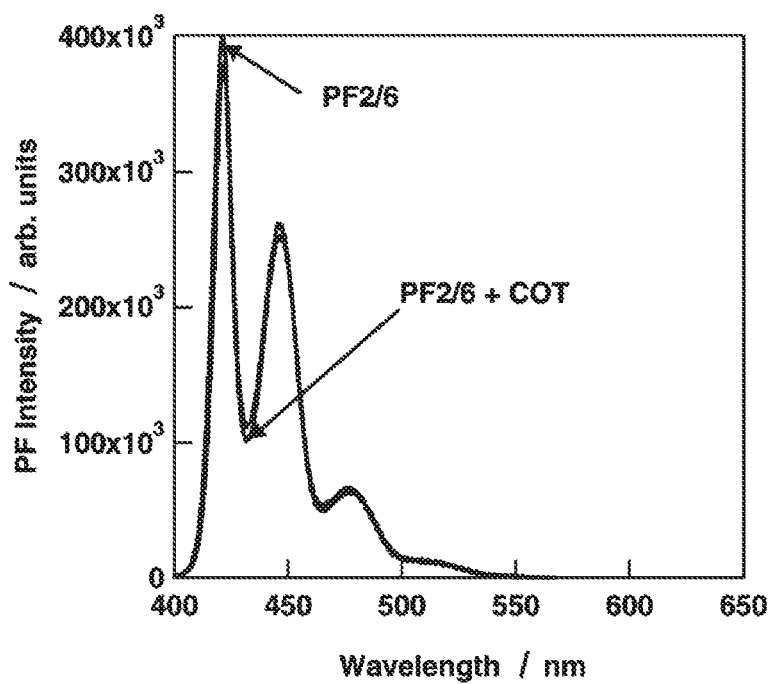
FIG. 2 shows the prompt fluorescence intensity of a neat PF2/6 film and of a PF2/6 film doped with COT registered at 77K.

FIG. 2 shows the spectra of the prompt fluorescence (PF) from a neat PF2/6 film and from a PF2/6 film doped with COT registered at 77 K during the laser pulse excitation. These spectra are coincident with the steady-state photoluminescence spectra of these films implying that the fluorescence in the range of 420-550 nm, caused by the radiative decay of singlet excitons, is dominant in this material. This is in line with earlier observations. Substantially the same fluorescence intensity was observed in neat and doped PF2/6 films, suggesting that the COT dopant does not quench singlet excitons in these films.

Figure 3:
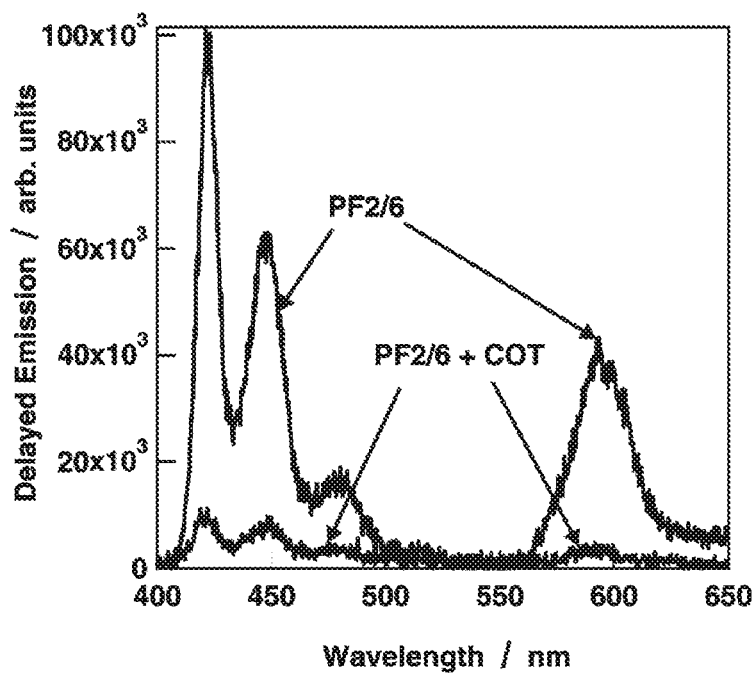
FIG. 3 shows the delayed emission spectra of a neat PF2/6 film and a PF2/6 film doped with COT, detected at 77 K at a time delay of 100 μs between the exciting laser pulse and the detection window.

The delayed emission spectra of the same neat PF2/6 film and PF2/6 film doped with COT detected by introducing a time delay ($t_{del}$=100 µs) between the exciting laser pulse and the detection window of the registration system is depicted in FIG. 3. As expected, delayed emission of the PF2/6 film (FIG. 3) comprises two different components with different spectral position. The short wavelength component in the blue spectral region, which is virtually identical to the prompt fluorescence spectrum, is due to delayed fluorescence (DF) from the $S_1$ state of PF2/6, while the second longer-wavelengths spectral component at ~590 nm can only be seen in the delayed emission and has been assigned to intrinsic phosphorescence (Ph) from the $T_1$ state. In contrast to very thin PF2/6 films (<100 nm) (not shown here), thicker drop-casted films normally do not exhibit vibronic fine structure of Ph spectra as could be seen from FIG. 3. This effect was explained before in terms of somewhat different morphology of films of different thicknesses and agrees completely with the spectra reported earlier.

Remarkable is that the intensity of the delayed emission from the neat and doped PF2/6 film was found to be substantially different, as opposed to their prompt fluorescence (FIG. 2). As can be seen from FIG. 3, both the DF and Ph are greatly reduced in films doped with COT. This implies a strong quenching of the delayed emission in PF2/6 films by COT molecules, while at the same time the prompt fluorescence is not affected. This can be attributed to the extremely large singlet-triplet ($S_1$-$T_1$) splitting of the COT molecules. The energy level scheme of PF2/6 and COT is shown in FIG. 1(d).

Figure 4:
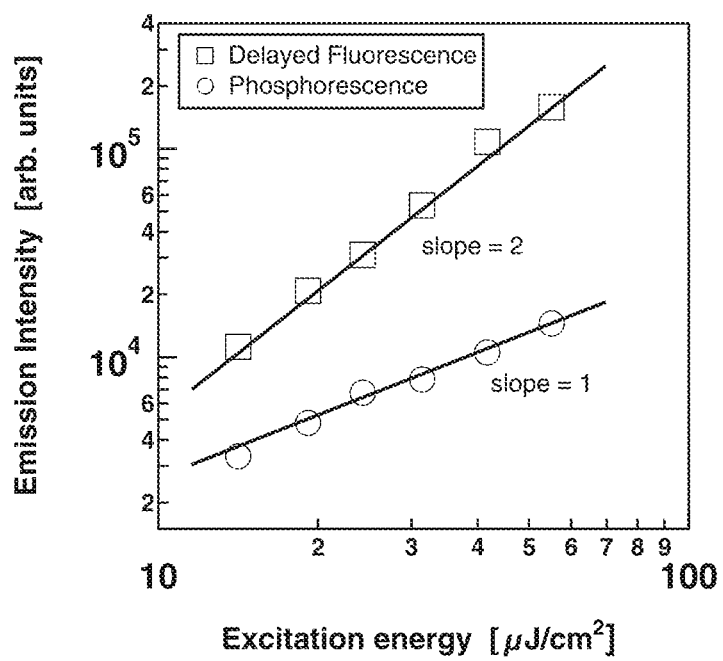
FIG. 4 shows the emission intensity of the Delayed Fluorescence and Phosphorescence emission in neat PF2/6 films as a function of laser excitation intensity.

FIG. 4 shows the intensity dependence of the DF and Ph emission in neat PF2/6 films upon the laser excitation intensity. The delayed emission spectra were recorded with a time delay of 75 ns and a gate width of 10 ms, i.e. in accumulation mode. The emission intensities plotted in FIG. 4 are the peak emission intensities (0-0 peak for the DF). The Ph intensity of PF2/6 films varies approximately linearly with the laser power, while the DF intensity increases quadratically with exciting laser intensity.

Figure 5:
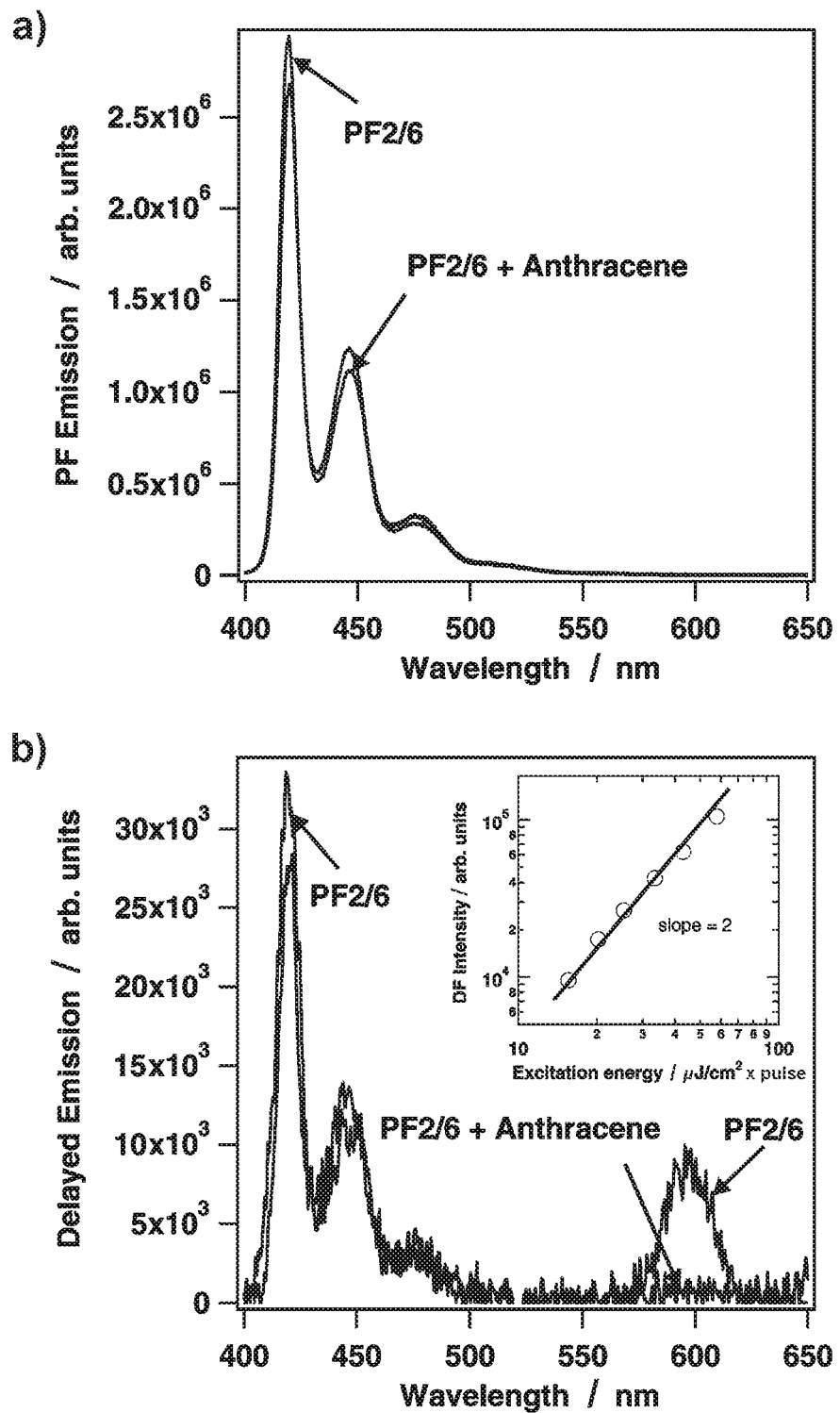
FIG. 5 illustrates the prompt fluorescence (FIG. 5(a)), and the delayed emission spectra (FIG. 5(b)) of a neat PF2/6 and of a PF2/6 film doped with anthracene, measured at 77 K. The inset of FIG. 5(b) shows the intensity of Delayed Fluorescence emission in anthracene doped PF2/6 films as a function of laser excitation intensity.

Further, the observed host triplet quenching effect in PF2/6 due to COT dopants is compared with the effect of introducing a conventional aromatic molecule with suitable triplet level position and sufficiently large $S_1T_1$ splitting. Anthracene (energy levels shown in FIG. 1(d)) is known to have a very low triplet level (1.78 eV) and an exceptionally large $S_1$-$T_1$ splitting compared to other organic conjugated small molecules and was therefore chosen as (vertical) triplet acceptor. Comparison of the prompt fluorescence of the neat PF2/6 film and a PF2/6 film doped with anthracene at 77 K is presented in FIG. 5(a). Delayed emission spectra of these films ($t_{del}$=100 μs) are shown in FIG. 5(b). From these results, it can be concluded that, similarly to the COT dopant, anthracene additives in a PF2/6 film do not affect fluorescence and at the same time strongly reduce phosphorescence intensity. The DF intensity, however, was found not to be reduced considerably upon doping the polymer with anthracene. This is clearly different from the results obtained with COT doping (FIG. 3). This suggests that this effect may be related to the much larger triplet lifetime of anthracene (several tens of ms) compared to the triplet lifetime of COT (100 μs).

The results presented in FIG. 3 clearly demonstrate that COT dopants quench very efficiently the phosphorescence of the host PF2/6 polymer, while the fluorescence of the host is not affected (FIG. 2). COT is a well-known triplet scavenger used in organic dye-solution lasers to reduce the accumulation of dye molecules in the triplet state and thereby eliminating triplet-state losses. The compound belongs to the so-called non-classical or non-vertical triplet acceptors as it exhibits a considerably faster triplet transfer rate in the endothermic regime $\Delta E_T$<0 (i.e. when the triplet state energy of the donor molecule $E_T^D$ is lower than that of the accepting molecule $E_T^A$) compared to that predicted for a thermally activated Arrhenius process. This type of triplet energy transfer is associated with triplet acceptor molecules with significant flexibility. The detailed mechanism for COT has been studied theoretically in terms of non-vertical (non-adiabatic) processes. For non-vertical acceptors the triplet transfer depends also on the (triplet acceptor) molecule itself and not only on the triplet energy, which is in contrast to classical acceptors where this process depends only on the triplet energy of the molecule. The non-vertical triplet energy transfer has been explained in terms of the breakdown of Frank-Condon restriction, implying that the geometry of the acceptor molecules changes simultaneously with its excitation, and by accounting for coupling with specific torsial modes of the acceptor molecules. It was demonstrated that non-vertical triplet transfer to COT is accompanied by a geometrical distortion of the molecule, which results in a considerable lowering of the triplet state due to molecular relaxation. Therefore COT has a low-lying relaxed triplet state and could act as acceptor with donors having a triplet excited-state energy equal to or higher than 0.8 eV.

A surprising result of the present study is that it was demonstrated that COT can be used as an efficient triplet scavenger also in a solid polymer film. Since during triplet energy transfer the COT molecule should be planarized—a process that can easily occur in liquid phase—the presented results suggest that such a structural reorganization is not hindered in a solid environment even at low temperature. In addition, the presented results show that triplets' diffusion in the host PF2/6 polymer is sufficiently efficient even at low temperatures. Another important implication of this study is that it suggests that non-classical non-vertical triplet acceptors could be considered as a promising class of efficient triplet scavengers also for future solid-state electrically-pumped organic lasers due to (i) an exceptionally large energy splitting between the lowest excited singlet state (4.39 eV for COT) and the triplet state, which is inherent for these compounds, and (ii) a reasonably short triplet lifetime (~100 μs for COT) that enables fast deactivation of triplet excitations. In this way, the accumulation of triplets, introducing triplet-state losses such as singlet-triplet annihilation and triplet-triplet absorption, could be considerably reduced.

Anthracene additives in PF2/6 films are an example of a classical triplet scavenger for which a vertical (adiabatic) triplet energy transfer process is operative and which also possesses a quite large singlet-triplet energy splitting (1.32 eV). As one can see from FIG. 5(b), anthracene dopants in PF2/6 films do quench host phosphorescence due to exothermic triplet energy transfer from the triplet state of the polymer ($E_T^{PF2/6}$=2.10 eV) to the one of anthracene ($E_T^{anthracene}$=1.78 eV). Since the singlet state of anthracene (3.1 eV) is higher than that of PF2/6, it can be expected that the prompt fluorescence intensity of the polymer is not quenched by the presence of anthracene additives (FIG. 5(a)).

Comparison of the delayed emission spectra of PF2/6 doped with COT and of PF2/6 doped with anthracene additives (FIG. 3 and FIG. 5(b)) shows, however, that these triplet scavengers have a very different effect on the delayed fluorescence (DF) of the PF2/6 polymer. As one can see, while COT dopants strongly quench the DF of the PF2/6 (FIG. 3), anthracene doping has almost no effect on the host DF (FIG. 5(b)).

Previous time-resolved photoluminescence studies reveal that the DF emission in PF2/6 polymer films is dominated by triplet-triplet annihilation. The measurements reported here support such a notion as indeed the DF intensity in the PF2/6 film was found to increase quadratically with the excitation intensity within the considered laser intensity range (FIG. 4). This clearly points to a bimolecular origin of the DF emission.

At the same time the phosphorescence intensity of the polymer increases linearly with the pumping intensity, implying that the DF is quadratically proportional to the triplet concentration in the film. Reduction of the DF intensity in PF2/6 films doped with COT can be readily explained by the fact that the COT molecules capture host triplets and deactivate them within the relatively short lifetime of the COT triplet state (~100 µs), thus preventing their possible annihilation. Anthracene additives in PF2/6 films also capture host triplets efficiently as evidenced by a strong reduction of the host phosphorescence (FIG. 5(b)); however, due to the very large radiative lifetime of the anthracene triplet state (>10 ms) triplets are not deactivated quickly, but rather accumulated on the anthracene molecules. Further, the DF emission in PF2/6 films doped with anthracene was found to originate also from a bimolecular process in the host-guest system since the DF intensity increases quadratically with the excitation intensity as one can see from the inset of FIG. 5(b). Since the host triplets are eventually transferred to the anthracene guest, as proven by strong quenching of the intrinsic PF2/6 phosphorescence (FIG. 5(b)), $T_{host}$-$T_{host}$ annihilation cannot be responsible for the observed DF. On the other hand, one can also exclude $T_{guest}$-$T_{guest}$ annihilation as dominant mechanism for the DF since no change in the DF intensity was observed when changing the laser pulse repletion rate from 1 to 20 Hz, which is expected to modulate the build-in of guest triplet population and thereby affect the DF intensity. Therefore it can be assumed that the observed bimolecular annihilation proceeds via a $T_{guest}$-$T_{host}$ annihilation reaction, i.e., when a mobile host triplet encounters a long-lived localized guest triplet excitation on an anthracene molecule. During such annihilation the excited singlet state of either the host or the guest molecule can be populated with equal probability, but since the host singlet state is lower than the singlet state of the anthracene dopant, only DF fluorescence of the PF2/6 polymer is observed.

In this study phosphorescence and delayed fluorescence of polyfluorene polymer films doped with cyclooctatetraene (COT) and anthracene were investigated by time-resolved photoluminescence measurements. Using the non classical triplet scavenger COT, employed before in liquid-phase organic dye lasers, anomalous non-vertical triplet energy transfer in solid conjugated polymer films was demonstrated for the first time. This triplet energy transfer behaves similar to the one of vertical triplet acceptors like anthracene. Thanks to their large singlet-triplet splitting, both dopant molecules are found to quench efficiently host phosphorescence without affecting the host fluorescence. In the case of COT, accumulation of triplet excitations can additionally be prevented owing to the relatively short lifetime of the COT triplet state.

Since accumulation of triplets under electrical pumping introduces severe triplet losses, non-vertical triplet scavengers, which posses a large $S_1$-$T_1$ splitting and an inherently short lifetime of their (relaxed) triplet state, might be promising candidates for quenching of host triplet excitations in future solid-state organic lasers.

In another aspect of the present invention, it is provided an organic light emitting device comprising a solid state light emitting material, the light emitting device comprising means for substantially reducing a triplet population (without reducing the singlet exciton density).

In preferred aspects of the organic light emitting device according to the invention, the means for substantially reducing a triplet population (without reducing the singlet exciton density) may comprise molecules exhibiting non-vertical triplet energy transfer being provided in the solid state organic material or at a distance smaller than the triplet exciton diffusion length from the solid state organic material. In the context of the present invention, molecules exhibiting non-vertical triplet energy transfer for use herein are preferably similar to those described herein-before. According to a preferred aspect of the organic light emitting device, the molecules exhibiting non-vertical triplet energy transfer are non-vertical triplet scavengers as described herein-before, and preferably selected from the group consisting of COT, cycloheptatriene (CHT), cis-stilbene, and combinations thereof. More preferably, the non-vertical triplet scavenger is selected to be COT.

In still another aspect of the organic light emitting device according to the invention, the molecule exhibiting non-vertical triplet energy transfer is preferably provided at a distance from the solid state organic material which is shorter than (about) 100 nm, preferably shorter than (about) 50 nm, more preferably shorter than (about) 10 nm, even more preferably shorter than (about) 1 nm.

According to still another aspect, the present invention relates to the use of molecules exhibiting non-vertical triplet energy transfer for substantially reducing the triplet population in a solid state organic material (without reducing the singlet exciton density). In the context of the present invention, molecules exhibiting non-vertical triplet energy transfer for use herein are preferably similar to those described herein-before. According to a preferred aspect of the use according to the invention, the molecules exhibiting non-vertical triplet energy transfer are non-vertical triplet scavengers as described herein-before, and preferably selected from the group consisting of COT, cycloheptatriene (CHT), cis-stilbene, and combinations thereof. More preferably, the non-vertical triplet scavenger is selected to be COT.

The invention claimed is:

1. A method for reducing a triplet population in a solid state organic semiconductor material of an organic light emitting device, the method comprising:
    incorporating, into the organic light emitting device, molecules exhibiting non-vertical triplet energy transfer in the solid state organic semiconductor material or at a distance smaller than a triplet exciton diffusion length from the solid state organic semiconductor material, wherein said molecules exhibiting non-vertical triplet energy transfer comprise non-vertical triplet scavenging material, wherein the non-vertical triplet scavenging material comprises a non-vertical triplet scavenger, wherein:
    a) a triplet level of the non-vertical triplet scavenger is lower than a triplet level of the solid-state organic semiconductor material;
    b) a singlet level of the non-vertical triplet scavenger is higher than a singlet level of the solid-state organic semiconductor material;
    c) the non-vertical triplet scavenger possesses an intrinsic triplet lifetime which is shorter than a triplet lifetime of the solid-state organic semiconductor material;
    d) the non-vertical triplet scavenger does not enhance inter-system crossing of the solid-state organic semiconductor material; and
    e) the molecules exhibiting non-vertical triplet energy transfer are selected from the group consisting of cyclooctatetraene (COT), cycloheptatriene (CHT), cis-stilbene, and combinations thereof.

2. The method according to claim 1, wherein an S1-T1 splitting of the non-vertical triplet scavenger is above 1 eV.

3. The method of claim 2, wherein the S1-T1 splitting of the non-vertical triplet scavenger is above 3 eV.

4. The method according to claim 1, wherein said molecules exhibiting non-vertical triplet energy transfer are COT.

5. The method according to claim 1, wherein at least one molecule exhibiting non-vertical triplet energy transfer is provided at a distance from the solid state organic semiconductor material which is shorter than 100 nm.

6. The method of claim 5, wherein the distance from the solid state organic semiconductor material is shorter than 1 nm.

7. The method according to claim 1, wherein the solid state organic semiconductor material comprises a light emitting material.

8. An organic light emitting device comprising:

a solid state organic semiconductor material; and means for reducing a triplet population comprising molecules exhibiting non-vertical triplet energy transfer being provided in the solid state organic semiconductor material or at a distance smaller than a triplet exciton diffusion length from the solid state organic semiconductor material, wherein the molecules exhibiting non-vertical triplet energy transfer comprise a non-vertical triplet scavenger, and wherein the non-vertical triplet scavenger is selected from the group consisting of cyclooctatetraene (COT), cycloheptatriene (CHT), cis-stilbene, and combinations thereof.

9. The organic light emitting device according to claim 8, wherein said molecules exhibiting non-vertical triplet energy transfer are provided at a distance from the solid state organic semiconductor material which is shorter than 100 nm.

10. The organic light emitting device according to claim 9, wherein the distance from the solid state organic semiconductor material is shorter than 1 nm.

11. The method of claim 1, wherein the intrinsic triplet lifetime is shorter than 200 μs.

* * * * *